(12) United States Patent
Chu et al.

(10) Patent No.: US 9,899,222 B2
(45) Date of Patent: Feb. 20, 2018

(54) TRENCH STRUCTURE ON SIC SUBSTRATE AND METHOD FOR FABRICATING THEREOF

(71) Applicant: Industrial Technology Research Institute, Hsin-Chu (TW)

(72) Inventors: Kuan-Wei Chu, Hsinchu County (TW); Ming-Jinn Tsai, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 0 days.

(21) Appl. No.: 14/975,995

(22) Filed: Dec. 21, 2015

(65) Prior Publication Data

US 2017/0140936 A1 May 18, 2017

(30) Foreign Application Priority Data

Nov. 12, 2015 (TW) .............................. 104137373 A

(51) Int. Cl.
*H01L 29/78* (2006.01)
*H01L 21/04* (2006.01)
*H01L 21/308* (2006.01)
*H01L 21/311* (2006.01)
*H01L 21/324* (2006.01)
(Continued)

(52) U.S. Cl.
CPC ...... *H01L 21/0475* (2013.01); *H01L 21/3081* (2013.01); *H01L 21/31105* (2013.01); *H01L 21/324* (2013.01); *H01L 29/0657* (2013.01); *H01L 29/1608* (2013.01)

(58) Field of Classification Search
CPC .................. H01L 21/3081; H01L 29/7813
See application file for complete search history.

(56) References Cited

U.S. PATENT DOCUMENTS 5,258,332 A 11/1993 Horioka et al.
5,571,374 A * 11/1996 Thero ................. H01L 21/0475
216/41

(Continued)

FOREIGN PATENT DOCUMENTS

| CN | 104241190 A | 12/2014 |
| TW | 200303596 | 9/2003 |
| TW | 201123358 | 7/2011 |

OTHER PUBLICATIONS

Taiwan Intellectual Property Office, Office Action dated Aug. 2, 2016.
(Continued)

*Primary Examiner* — Peniel M Gumedzoe
*Assistant Examiner* — Christopher Johnson
(74) *Attorney, Agent, or Firm* — WPAT, PC

(57) ABSTRACT

A trench structure on a SiC substrate and method for fabricating thereof is provided. The fabricating method includes: providing a SiC substrate; forming a protection layer on the SiC substrate; forming an resisting layer on the protection layer; patterning the resisting layer and the protection layer to form an opening; patterning the SiC substrate by using the patterned resisting layer as a hard mask to form a trench; removing the patterned resisting layer; performing a high-temperature annealing process to form a rounded bottom of the trench; and removing the protection layer.

11 Claims, 3 Drawing Sheets

(51) Int. Cl.
*H01L 29/06* (2006.01)
*H01L 29/16* (2006.01)

(56) References Cited

U.S. PATENT DOCUMENTS

| | | | |
|---|---|---|---|
| 6,180,466 | B1 | 1/2001 | Ibok |
| 6,235,643 | B1 | 5/2001 | Mui et al. |
| 6,559,031 | B2 | 5/2003 | Fujita |
| 6,670,275 | B2 | 12/2003 | Lee et al. |
| 6,825,087 | B1 | 11/2004 | Sharp et al. |
| 7,063,751 | B2 | 6/2006 | Urakami et al. |
| 7,309,641 | B2 | 12/2007 | Huang |
| 7,410,873 | B2 | 8/2008 | Kuribayashi |
| 7,439,141 | B2 | 10/2008 | Kim et al. |
| 7,892,929 | B2 | 2/2011 | Chen et al. |
| 8,470,672 | B2 | 6/2013 | Endo et al. |
| 2005/0009255 | A1 | 1/2005 | Chiola et al. |
| 2005/0042871 | A1 | 2/2005 | Tzou et al. |
| 2008/0085606 | A1* | 4/2008 | Fischer ............ H01L 21/76816 438/736 |
| 2008/0220620 | A1* | 9/2008 | Kawada ............ H01L 21/0475 438/795 |
| 2010/0025695 | A1* | 2/2010 | Shibagaki ............ H01L 21/046 257/77 |

OTHER PUBLICATIONS

Kim et al. "A highly reliable trench DMOSFET employingself-align technique and hydrogen annealing", Dec. 2001, pp. 594-596, Electron Device Letters, IEEE (vol. 22, Issue: 12), IEEE Electron Devices Society.

Kim et al. "Behavior of trench surface by H2 annealing forreliable trench gate oxide". Nov. 22, 2002, Journal of Crystal Growth 255 (2003) 123-129, ScienceDirect.com.

Hiruta et al. "Evolution of surface morphology of Si-trenchsidewalls during hydrogen annealing", Jul. 29, 2004, Applied Surface Science 237 (2004) 63-67, ScienceDirect.com.

Kuribayashi et al. "Hydrogen pressure dependence of trenchcorner rounding during hydrogen annealing", Oct. 8, 2003, J. Vac. Sci. Technol. A 22(4), American Vacuum Society.

Matsuda et al. "Novel corner rounding process for shallowtrench isolation utilizing MSTS (Micro-Structure Transformation of Silicon)", Dec. 6, 1998, IEEE, San Francisco, CA, USA.

Luoh et al. "Stress release for shallow trench isolation bysingle-wafer, rapid-thermal steam oxidation", 2002,Advanced Thermal Processing of Semiconductors, 2002. RTP 2002. 10th IEEE International Conference, IEEE.

Kim et al. "Trench corner rounding technology using hydrogen annealing for highly reliable trench DMOSFETs", 2000, Power Semiconductor Devices and ICs, May 22, 2000. Proceedings. The 12th International Symposium, IEEE.

* cited by examiner

TRENCH STRUCTURE ON SIC SUBSTRATE AND METHOD FOR FABRICATING THEREOF

CROSS REFERENCE TO RELATED APPLICATION

All related applications are incorporated by reference. The present application is based on, and claims priority from, Taiwan Application Serial Number 104137373, filed on Nov. 12, 2015, the disclosure of which is hereby incorporated by reference herein in its entirety.

TECHNICAL FIELD

The technical field relates to a trench structure on SiC substrate and the method for fabricating thereof.

BACKGROUND

SiC features wide band gap, high thermal conductivity and low thermal expansion rate, etc., which is the material able to compensate for the insufficient physical properties of the silicon. Therefore, SiC is applicable to high-frequency, high electric power device and power device, etc.

Nowadays, semiconductor devices are more highly-integrated, so it is very important to achieve high-precision patterns; therefore, the trench structure will be obtained. The trench structure of SiC is usually processed by dry etching to obtain high aspect ratio and vertical sidewalls. However, it is hard to form a rounded bottom of a trench by dry-etching processes. Accordingly, a high-temperature annealing process in an inert gas environment is usually performed so as to form a rounded bottom of the trench. However, the surface of the SiC material will also be roughened by the high-temperature annealing process, which is a trade-off to obtain a rounded bottom of the trench.

SUMMARY

The present disclosure is related to a trench structure on SiC substrate and method for fabricating thereof; more specifically, the surface of the substrate is covered by a protection layer during the annealing process so as to avoid the surface of the substrate being roughened due to the annealing process.

A method for fabricating a trench structure is provided, which may include: providing a SiC substrate; forming a protection layer on the SiC substrate; forming an resisting layer on the protection layer; patterning the resisting layer and the protection layer to form an opening, patterning the SiC substrate by using the patterned resisting layer as a hard mask to form a trench; removing the patterned resisting layer; performing an annealing process to form a rounded bottom of the trench; and removing the protection layers.

A trench structure on SiC substrate is provided, which may include: a lateral trench wall which is vertical to the surface of the SiC substrate; and a trench bottom connected to the lateral trench wall, wherein the trench bottom may have rounded surface.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
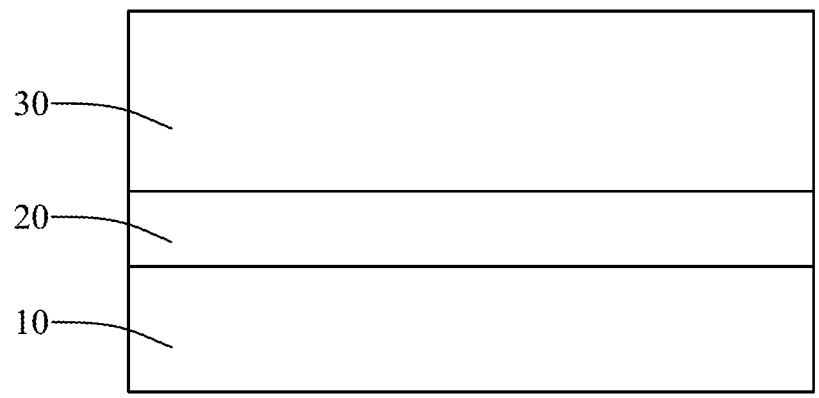
FIG. 1 is a structure cross-sectional view of a method for fabricating a trench structure in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1-FIG. 5 illustrate structure cross-sectional views of a method for fabricating a trench structure in accordance with the present disclosure. The following paragraphs describe the first embodiment of the process for fabricating a trench in accordance with the present disclosure. As shown in FIG. 1; a SiC substrate 10 is provided, which may be a SiC substrate processed or not processed by the activation process. In the embodiment, the SiC substrate 10 has been processed by the activation process. The activation process may be performed by using inert gases, into a high-temperature chamber more than 1600° C. However, the above is just an example instead of a limitation, and the present disclosure will not be limited thereby.

Next, a protection layer 20 and a resisting layer 30 are orderly formed on the SIC substrate 10. The material of the protection layer 20 may be, for example, graphite or aluminum nitride (AlN). The method for forming the protection player 20 may be, for example, deposition. When the material of the protection layer 20 is graphite, the protection layer 20 can be formed by high-temperature carbonization, such as photoresist sintering. The material of the resisting layer 30 may be, for example, silicon dioxide ($SiO_2$), silicon nitride (SiNx), or metals; the method for forming the resisting layer 30 may be, for example, deposition.

Figure 2:
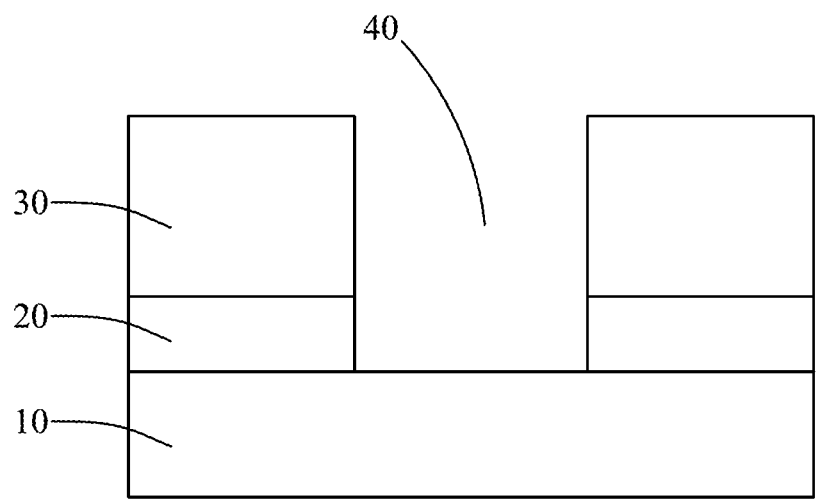
FIG. 2 is a structure cross-sectional view of a method for fabricating a trench structure in accordance with an embodiment of the present disclosure.

Afterward, as shown in FIG. 2, the protection layer 20 and the resisting layer 30 is patterned to form an opening 40. The method for patterning the protection layer 20 and the resisting layer 30 may be, for example, as follows: using a photoresist as a mask to etch the protection layer 20 and the resisting layer 30; removing the photoresist or the hard mask after the etching process is finished, or directly patterning the protection layer 20 and the resisting layer 30 by laser direct-writing.

Figure 3:
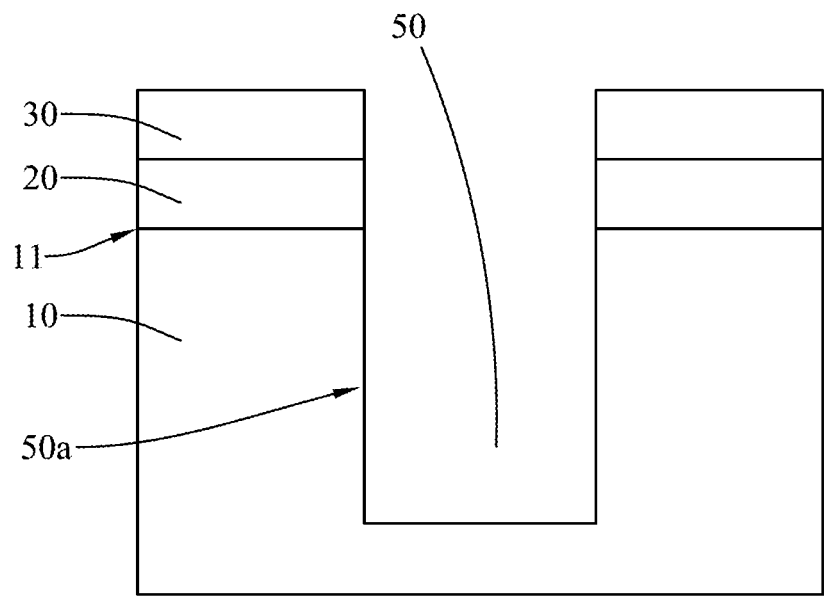
FIG. 3 is a structure cross-sectional view of a method for fabricating a trench structure in accordance with an embodiment of the present disclosure.

As shown in FIG. 3, the patterned resisting layer 30 is used as a hard mask to pattern the SiC substrate 10 to form a trench structure 50, and the trench structure 50 includes a lateral trench wall 50a which is vertical to the surface 11 of the SiC substrate 10. The method to pattern the SiC substrate 10 is dry etching; for instance, the SiC substrate 10 can be patterned by the plasma etching to inject the gases including the following combination, such as sulfur hexafluoride ($SF_6$), oxygen ($O_2$) and argon (Ar), or nitrogen trifluoride ($NF_3$), hydrogen bromide (HBr) and oxygen ($O_2$) to etch the SiC substrate 10.

Figure 4:
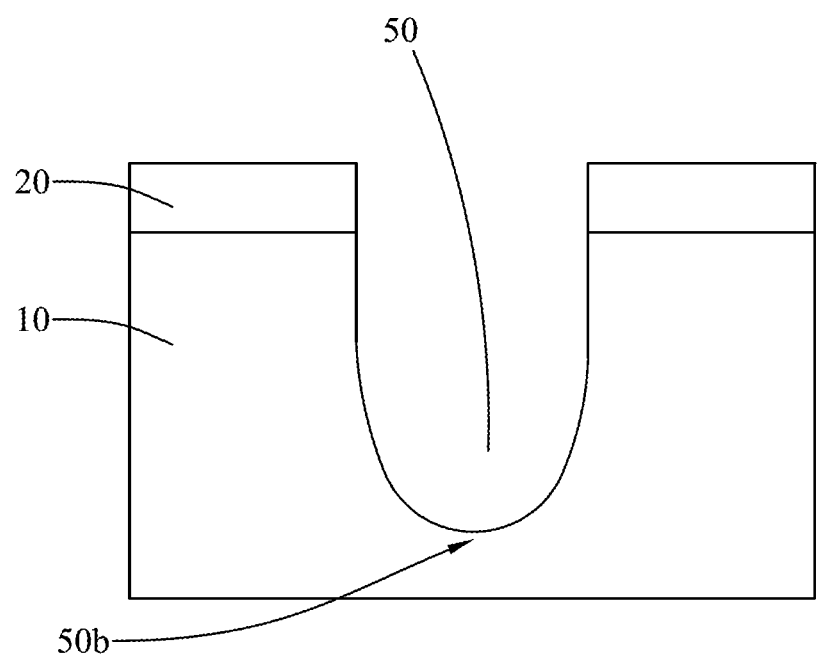
FIG. 4 is a structure cross-sectional view of a method for fabricating a trench structure in accordance with an embodiment of the present disclosure.

As shown in FIG. 4, the patterned resisting layer 30 is removed; now, the SiC substrate 10 is completely covered by the protection layer 20 except the trench structure 50; next, the SiC substrate 10 is processed by the annealing process so as to form a rounded trench bottom 50b in the trench structure 50. In the embodiment, the annealing process may be performed by using hydrogen, nitrogen or inert gases, etc., between 1450° C. and 1600° C.

Figure 5:
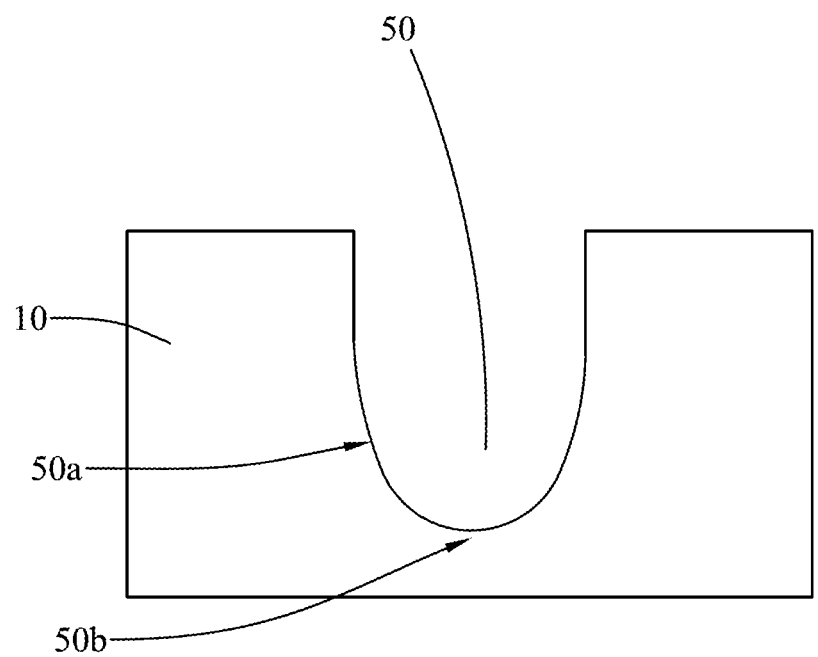
FIG. 5 is a structure cross-sectional view of a method for fabricating a trench structure in accordance with an embodiment of the present disclosure.

As shown in FIG. 5, after the annealing process is finished, the protection layer 20 is removed to finish the trench structure 50 including the lateral trench wall 50a and the trench bottom 50b; more specifically, the lateral trench wall 50a and the surface 11 of the SiC substrate 10 form a right angle, and the trench bottom 50b has a rounded surface. The surface 11 of the SiC substrate 10 is completely covered by the protection layer 20 except the trench structure 50 during the annealing process; accordingly, the protection layer 20 can protect the surface 11 of the SiC substrate 10 from being roughened due to high temperature during the annealing process for the purpose of avoiding the joint, between the lateral trench wall 50a and the surface 11 of the SiC substrate 10, being rounded in order to ensure the internal between two adjacent trenches is proper when a lot of trench structures 50 are manufactured.

Similarly, with reference to FIG. 1-FIG. 5 for the second embodiment of the present disclosure, the manufacturing process of the second embodiment of the present disclosure is almost the same with that of the first embodiment of the present disclosure; the following description only discusses the differences between the first embodiment and the second embodiment, but the similarities of the two embodiments will not be discussed herein. In the second embodiment, as shown in FIG. 1, a SiC substrate 10 is provided, which may be a SiC substrate not processed by the activation process. As shown in FIG. 4, the SiC substrate 10 is processed by the annealing process to form rounded trench bottom 50b. In the second embodiment of the present disclosure, the high-temperature annealing process may be performed by using nitrogen or inert gases, etc., between 1600° C. and 1850° C.

It is worthy to note that the temperature of the annealing process is increased to high temperature, 1600° C., in the second embodiment of the present disclosure; since the SiC structure 10 is completely covered by the protection layer 20 except the trench structure 50, the surface 11 of the SiC substrate 10 will not be damaged by the high-temperature annealing process of the embodiment; moreover, the rounded trench bottom 50b and the activation process of the SiC substrate 10 can be finished at the same time during the high-temperature annealing process.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for fabricating a trench structure, comprising:
   providing a SiC substrate;
   forming a graphite layer on the SiC substrate by photoresist sintering to serve as a protection layer;
   forming a resisting layer on the protection layer;
   patterning the resisting layer and the protection layer to form an opening;
   patterning the SiC substrate by using the resisting layer as a mask to form a trench;
   removing the resisting layer; and
   performing an annealing process to the SiC substrate covered with the protection layer to form a rounded bottom of the trench, and then removing the protection layer.

2. The method of claim 1, wherein a temperature of the annealing process is between 1450° C. and 1850° C.

3. The method of claim 1, wherein a temperature of the annealing process is between 1600° C. and 1850° C., and the SiC substrate is simultaneously processed by an activation process during the annealing process.

4. The method of claim 1, wherein the resisting layer is made of silicon nitride (SiNx).

5. The method of claim 1, wherein the resisting layer is made of a metal.

6. The method of claim 2, wherein the annealing process is performed in a nitrogen gas environment.

7. The method of claim 3, wherein the annealing process is performed in a nitrogen gas environment.

8. The method of claim 1, wherein the resisting layer is made of silicon dioxide ($SiO_2$).

9. The method of claim 2, wherein the annealing process is performed in a hydrogen gas environment.

10. The method of claim 2, wherein the annealing process is performed in an inert gas environment.

11. The method of claim 3, wherein the annealing process is performed in an inert gas environment.

* * * * *